United States Patent
Satoh et al.

(10) Patent No.: US 8,367,577 B2
(45) Date of Patent: Feb. 5, 2013

(54) THIN FILM OF ALUMINUM NITRIDE AND PROCESS FOR PRODUCING THE THIN FILM OF ALUMINUM NITRIDE

(75) Inventors: Issei Satoh, Itami (JP); Naho Mizuhara, Itami (JP); Keisuke Tanizaki, Itami (JP); Michimasa Miyanaga, Osaka (JP); Takashi Sakurada, Itami (JP); Yoshiyuki Yamamoto, Itami (JP); Hideaki Nakahata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 482 days.

(21) Appl. No.: 12/602,104

(22) PCT Filed: Feb. 18, 2009

(86) PCT No.: PCT/JP2009/052747
§ 371 (c)(1),
(2), (4) Date: Nov. 27, 2009

(87) PCT Pub. No.: WO2009/107525
PCT Pub. Date: Sep. 3, 2009

(65) Prior Publication Data
US 2010/0209622 A1    Aug. 19, 2010

(30) Foreign Application Priority Data

Feb. 27, 2008 (JP) ................................. 2008-046335
Jan. 22, 2009 (JP) ................................. 2009-012038

(51) Int. Cl.
*C04B 35/581* (2006.01)

(52) U.S. Cl. ...................... 501/98.4; 428/704; 360/324.1

(58) Field of Classification Search .................. 501/98.4, 501/98.5, 98.6; 428/704; 360/324.1, 324.2, 360/324.11
See application file for complete search history.

(56) References Cited

U.S. PATENT DOCUMENTS

| | | | | |
|---|---|---|---|---|
| 5,668,524 A * | 9/1997 | Aida et al. | | 338/308 |
| 5,777,543 A * | 7/1998 | Aida et al. | | 338/308 |
| 6,680,134 B2 * | 1/2004 | Maurer et al. | | 428/698 |
| 6,839,273 B2 * | 1/2005 | Odagawa et al. | | 365/171 |
| 7,682,709 B1 * | 3/2010 | Davis et al. | | 428/698 |
| 2006/0183625 A1 * | 8/2006 | Miyahara | | 501/98.4 |
| 2006/0244011 A1 * | 11/2006 | Saxler | | 257/194 |
| 2008/0083970 A1 * | 4/2008 | Kamber et al. | | 257/615 |

FOREIGN PATENT DOCUMENTS

WO   WO-2004-059745 A1   7/2004

OTHER PUBLICATIONS

M. Okamoto et al., "The Ohmic Character of Doped AlN Films," Diamond and Related Materials, 2001, pp. 1322-1325, vol. 10, Elsevier, NY.

Tzu-Fang Huang et al., "Growth of Epitaxial AlxGa1—xN Films by Pulsed Laser Deposition," Applied Physics Letters, Mar. 9, 1998, pp. 1158-1160, vol. 72, No. 10, American Institute of Physics, NY.

Moo-Seong Kim et al., "Tunnel Magnetoresistance in GaCrN/AlN/GaCrN Ferromagnetic Semiconductor Tunnel Junctions," Applied Physics Letters, 2006, pp. 232511-1 to 232511-3, vol. 89, American Institute of Physics, NY.

* cited by examiner

*Primary Examiner* — Karl Group
(74) *Attorney, Agent, or Firm* — James W. Judge

(57) ABSTRACT

Flat, thin AlN membranes and methods of their manufacture are made available. An AlN thin film (2) contains between 0.001 wt. % and 10 wt. % additive atomic element of one or more type selected from Group-III atoms, Group-IV atoms and Group-V atoms. Onto a base material (1), the AlN thin film (2) is formable utilizing a plasma generated by setting inside a vacuum chamber a sintered AlN ceramic containing between 0.001 wt. % and 10 wt. % additive atomic element of one or more type selected from Group-III atoms, Group-IV atoms and Group-V atoms, and with the base material having been set within the vacuum chamber, irradiating the sintered AlN ceramic with a laser.

5 Claims, 2 Drawing Sheets

THIN FILM OF ALUMINUM NITRIDE AND PROCESS FOR PRODUCING THE THIN FILM OF ALUMINUM NITRIDE

TECHNICAL FIELD

The present invention relates to aluminum nitride (also termed "AlN" hereinafter) thin films, and methods of their manufacture, employable for example as insulating barrier layers in tunneling magnetoresistance (TMR) devices.

BACKGROUND ART

AlN is a physically and chemically stable material, and since it also has outstanding characteristics such as insulating and piezoelectric properties, the material is used in a variety of applications. One illustration of how AlN is used would be the instance in which AlN thin films are employed as insulating barrier layers in tunneling magnetoresistive devices, which is set forth, for example, in Asahi et al., *Applied Physics Letters* 89, 232511 (2006). In the just-cited reference, the TMR effect is confirmed in GaCrN/AlN/GaCrN ferromagnetic semiconductor tunnel junctions, albeit at low temperature (77K).

Non-Patent Document 1: Asahi et al., *Applied Physics Letters* 89, 232511 (2006)

DISCLOSURE OF INVENTION

Problem Invention is to Solve

In tunneling magnetoresistive devices based on ferromagnets and superconductors, guaranteeing the uniformity of the thin insulating barrier layer that forms the tunnel barrier presents particular difficulties. This situation has been prohibitive of enhancing performance (e.g., to have a low leakage current, high on/off ratio) and heightening reproducibility of tunneling magnetoresistive devices.

Generally in fabricating thin films of any sort, creating a uniform and flat ultrathin film (in the several nm range) is particularly challenging. Thus far, success in realizing high-level reproducibility has been proven only with AlOx and MgO compounds obtained by the thin vapor-deposition, followed by oxidation, of Al and Mg. While this success relies on the ease with which both Al and Mg oxidize, as far as nitride compounds are concerned, techniques for nitridizing metallic thin films after they have been formed are problematic, such that a procedure enabling the formation of nitride films with a high degree of reproducibility has yet to be established.

In current hard-disk-drive (HDD) reading heads and non-volatile magnetic memory (magnetoresistive random access memory—MRAM), metals and alloys are employed as the sandwiching ferromagnetic electrode layers.

In that regard, employing ferromagnetic semiconductors and halfmetal materials, such as GaTMAs (TM—magnetic transition-metal ion) or GaTMN, as the sandwiching ferromagnetic electrode layers makes it possible to obtain higher on/off ratios, and by having a compound semiconductor be the base, the realization of devices of totally new functions in which magnetic characteristics and optical characteristics are combined may be anticipated.

In tunneling magnetoresistive devices that employ ferromagnetic semiconductors such as GaTMAs and GaTMN for the sandwiching ferromagnetic electrode layers, AlN, with its excellent lattice matching and highly insulative properties, is promising as the material used in the insulating barrier layer.

As noted above, however, a procedure enabling the formation, with a high degree of reproducibility, of thin nitride films that are uniform and flat has not been established, thus of course neither has a procedure enabling the highly reproducible formation of thin AlN that is uniform and flat been established.

In the document cited above, while it is reported that a thin AlN insulating barrier layer of 3 nm thickness could be formed, no mention is made of the flatness of the AlN insulating barrier layer. Moreover, as far as can be seen from the transmission electron microscopy (TEM) micrographs, the flatness, especially of the bottom side, is not satisfactory, indicating that the formation of flat and fine AlN thin films is, not surprisingly, difficult.

An object of the present invention, brought about in order to resolve issues such as the foregoing, is to make available flat and fine AlN thin films and methods of their manufacture.

Means for Resolving the Problem

The present invention is an effort to improve the flatness of aluminum nitride thin films, by deliberately adding to the aluminum nitride atoms that are not unavoidable impurities. More specifically, an aluminum nitride thin film involving the present invention is characterized in containing between 0.001 wt. % and 10 wt. % additive atomic element of one or more type selected from Group-III atoms, Group-IV atoms and Group-V atoms.

Examples of the foregoing additive atomic element that can be given include at least one type of atom selected from carbon (C), silicon (Si), germanium (Ge), gallium (Ga), indium (In), phosphorus (P), arsenic (As), boron (B), tin (Sn) and antimony (Sb). Preferably said additive atomic element is one or more type of Group-IV atoms, such as carbon and silicon.

A method, involving the present invention, of manufacturing an aluminum nitride thin film comprises the following steps. A sintered aluminum nitride ceramic containing between 0.001 wt. % and 10 wt. % additive atomic element of one or more type selected from Group-III atoms, Group-IV atoms and Group-V atoms (with Ge and Sn in particular, between 0.001 wt. % and 5 wt. % is preferable) is set inside a vacuum chamber. A base material is set within the vacuum chamber. The sintered aluminum nitride ceramic is irradiated with a laser to evolve a plasma, and the plasma is utilized to form onto the base material an aluminum nitride thin film containing the foregoing additive atomic element.

The sintered aluminum nitride ceramic containing an above-listed additive atomic element is manufacturable, for example, by sintering, under a nitrogen atmosphere within a vacuum vessel, a compact formed by mixing together between 0.001 wt. % and 10 wt. % of a powder of a foregoing additive atomic element, and a powder of aluminum nitride. As the additive atomic element, at least one type of atom selected from carbon (C), silicon (Si), germanium (Ge), gallium (Ga), indium (In), phosphorus (P), arsenic (As), boron (B), tin (Sn) and antimony (Sb) can be enumerated.

For the foregoing base material, a compound semiconductor substrate composed of a compound semiconductor such as GaN, or an insulator substrate composed of an insulator such as $Al_2O_3$ can be employed. It is then preferable that the aluminum nitride thin film containing an above-listed additive atomic element be formed while the base material is heated.

It is preferable to have the interior of the aforesaid vacuum chamber be a nitrogen atmosphere. Furthermore, the aforesaid plasma is, for example, an ablation plasma, which is the plasma phenomenon accompanying the explosive emission of particles from a solid.

Effects of the Invention

According to the present invention, deliberately adding to aluminum nitride atoms that are not unavoidable impurities makes it possible to improve the flatness of aluminum nitride thin films.

LEGEND

1: base material; 2: AlN thin film; 3: first ferromagnetic electrode layer; 4: second ferromagnetic electrode layer; 5: conducting layer; 7: insulating layer; 8: substrate; 10: PLD film-producing system; 11: laser light source; 12: vacuum chamber; 13: stepper motor; 14: sinter source material; 15: stage; 16: holder; 17: control unit; 18: reflection high-energy electron diffraction device; 19: gas-supply unit; 20: tunnel barrier layer

BEST MODE FOR CARRYING OUT THE INVENTION

Below, using FIG. 1 to FIG. 4, an explanation of modes embodying of the present invention will be made.

Embodying Mode 1

Figure 1:
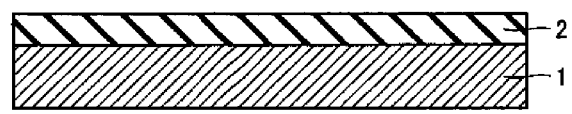
FIG. 1 is a sectional diagram of an AlN thin film in Embodying Mode 1 of the present invention.

To begin with, using FIGS. 1 and 2, an explanation of Mode 1 of embodying the present invention will be made. FIG. 1 is a sectional diagram representing an AlN thin film 2 in the present Embodying Mode 1.

As indicated in FIG. 1, an AlN thin film 2 is formed onto a base material 1. For the base material 1, various materials are conceivable, including conductors, insulators, semiconductors, or substances in which these are combined. Since the thickness of the AlN thin film 2 typically is some 10 nm or less, (for example, around 5 nm), ordinarily a base material capable of retaining the AlN thin film 2 is necessary.

To the foregoing AlN thin film 2, atoms that are not unavoidable impurities are deliberately added. The flatness of the AlN thin film 2 can thereby be improved. As the atoms added to the AlN thin film 2, one or more types of additive atomic element selected from Group-III atoms, Group-IV atoms and Group-V atoms can be cited. In particular, at least one type of atom selected from carbon (C), silicon (Si), germanium (Ge), gallium (Ga), indium (In), phosphorus (P), arsenic (As), boron (B), tin (Sn) and antimony (Sb) can be utilized as the additive atomic element. Preferably, at least one or more type of Group-IV atoms, such as carbon and silicon, is used as the additive atomic element.

As long as the addition amount by which the atoms are added to the AlN thin film 2 is at the level that cannot be called unavoidable impurities, that quantity will be acceptable; specifically, having it be between 0.001 wt. % and 10 wt. % is satisfactory.

Next, using FIG. 2 an explanation of a method of manufacturing the AlN thin film 2 in the present Embodying Mode 1 will be made. FIG. 2 is a simplified configurational diagram of a PLD (pulsed laser deposition) film-producing system employable in the formation of aluminum nitride thin films.

The PLD film-producing system 10 is furnished with: a laser light source 11 that is capable of radiating a laser beam; a vacuum chamber 12; a stage 15 that is capable of carrying a sinter source material 14, which is the irradiation target; a stepper motor 13 that is capable of driving the stage 15; a holder 16 that is capable of retaining the base material 1; a control unit 17 that is able to carry out operational control of the stepper motor 13 and laser light source 11; a reflection high-energy electron diffraction (RHEED) 18; a gas-supply unit 19 that supplies gas to the vacuum chamber 12 interior; and a heater, installed in the holder 16, that is capable of heating the base material 1. It will be appreciated that the PLD film-producing system 10 includes various components other than the foregoing, but the illustration and description of such components is omitted for convenience of explanation.

To begin with, a sintered AlN ceramic containing between 0.001 wt. % and 10 wt. % additive atomic element of one or more type selected from Group-III atoms, Group-IV atoms and Group-V atoms is fabricated.

The sintered AlN ceramic is fabricated, for example, by mixing together and press-forming 10 wt. % carbon powder, which is a Group-IV atomic element, and 90 wt. % of an AlN powder to prepare a compact, and sintering the compact 2 hours at 2000° C. in a nitrogen atmosphere within a vacuum vessel (under a pressure of $10^{-6}$ torr). Herein, instead of the carbon powder, it is possible to utilize 10 wt. % of a silicon powder (Group-IV atomic element), or, at a combined total of 10 wt. %, a powder blend of silicon and carbon powders.

Figure 2:
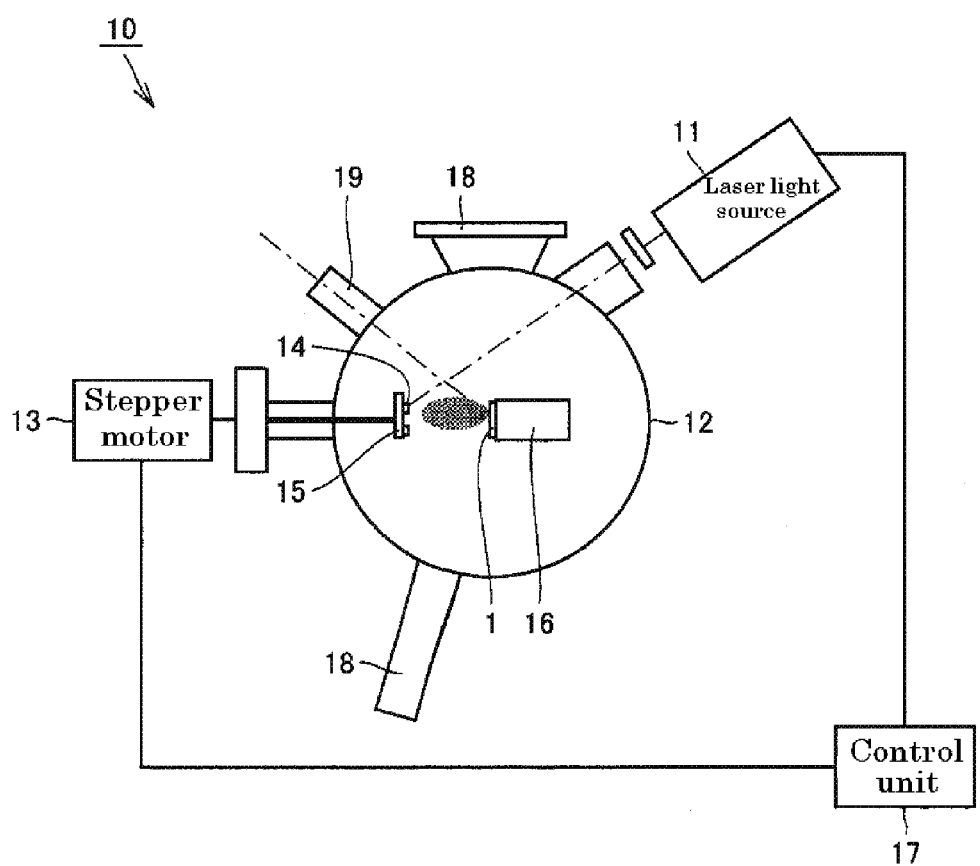
FIG. 2 is a diagram presenting a simplified configurational view of a PLD film-producing system.
Figure 3:
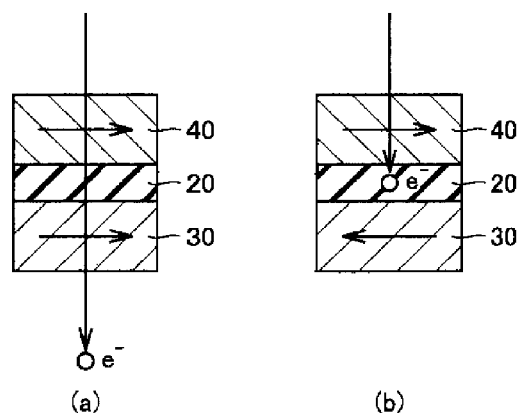
FIG. 3 is an explanatory diagram illustrating the operating principle of tunneling magnetoresistive devices.

The sintered AlN ceramic obtained as in the foregoing is set inside the vacuum chamber 12 represented in FIG. 2. In particular, it is placed onto the stage 15 depicted in FIG. 2.

Next, the base material 1, which is the film-deposition subject, is set into a position that is on the front side of the holder 16 installed inside the vacuum chamber 12, and that opposes the foregoing sintered AlN ceramic.

For the base material 1, a compound semiconductor substrate constituted by a compound semiconductor such as GaN, or an insulator substrate constituted by an insulator such as $Al_2O_3$, of diameter at the 1-inch (approx. 2.5-cm) level, is employed.

Therein, the front side of the base material 1 is preferably made flat. Preferably it is in a flat state in which, for example, a value expressing the average surface roughness per unit area as root mean square (RMS) is some 0.1 nm or less. Having the front side of the base material 1 be in a flat state can contribute to improving the flatness of the surface of the AlN thin film 2.

Next, the laser beam that is emitted from the laser light source 11 strikes the aforedescribed sintered AlN ceramic, being the sinter source material 14. Herein, a KrF excimer laser with a lasing wavelength of 248 nm, pulse-repetition frequency of 10 Hz, and per-pulse energy of 1 to 3 J/shot can, for example, be used as the laser. Alternatively, an ArF excimer laser whose lasing wavelength is 193 nm can also be employed.

Therein, the vacuum chamber 12 interior is rendered a nitrogen atmosphere and put into a vacuum state of some $1\times10^{-3}$ torr to $1\times10^{-6}$ torr or less. Having the vacuum chamber 12 interior be a nitrogen atmosphere enables nitrogen to be supplied during formation of the AlN thin film 2. It will be appreciated that the nitrogen can be supplied to the vacuum chamber 12 interior by means of the gas-supply unit 19.

In irradiating the sintered AlN ceramic with a laser beam, a short-wavelength laser such as noted above is preferably used. When a short-wavelength laser is employed, the absorption coefficient will be large, such that in the vicinity of the sintered AlN ceramic front side, almost all of the laser light will thus be absorbed. The surface temperature of the sintered AlN ceramic rises abruptly as a result, making it possible to generate an ablation plasma (the plasma accompanying the explosive emission of particles from a solid) inside the vacuum chamber 12. The ablation particles contained within the plasma travel to the base material 1 while undergoing changes of state by recombining and by colliding and reacting with the ambient gas. The particles having arrived on the base material 1 then all disperse over the base material 1 and settle into stable sites to become a thin film. An AlN thin film 2 containing additive atomic elements of the sort listed earlier can thereby be grown onto the base material 1.

When a foregoing AlN thin film 2 is to be grown, it is preferable that the AlN thin film 2, containing the aforesaid additive atomic elements, be formed while the base material 1 is heated. Heating the base material 1 to a temperature of some 800° C., for example, is preferable. To heat the base material 1, the above-noted heater installed in the vacuum chamber 12 may be employed, although the base material 1 can be heated by other methods, such as flowing a current into the base material 1.

Herein, deposition thickness of the AlN thin film 2 can be monitored by means of oscillations from the reflection high-energy electron diffraction (RHEED) device 18, mounted in the vacuum chamber 12.

The inventors in the present application actually fabricated by the aforedescribed technique AlN thin films 2 of approximately 5 nm thickness, containing 10 wt. % carbon and silicon, onto GaN substrates and onto $Al_2O_3$ substrates of 1 inch (approx. 2.5 cm) diameter, and measured the surface roughness; the results will be explained using the table presented below.

To characterize the surface of the post-growth AlN thin film 2, an atomic force microscope (AFM) was employed. Along the AlN thin film 2 surface, with a region measuring 50 µm×50 µm taken as the unit-area region, a plurality of unit-area regions was selected. The surface roughness in these regions was then measured, and the average roughness was calculated. This value was taken as the surface roughness per unit area, and was expressed as the root mean square (RMS). The results are set forth in the following table.

TABLE

| Sample | Comparative examples | Embodiment 1 | Embodiment 2 | Embodiment 3 |
|---|---|---|---|---|
| RMS (nm) | 0.3 | 0.1 | 0.1 | 0.1 |

In the table above, the comparative examples are instances in which an AlN thin film 2 of approximately 5 nm thickness was grown onto a GaN substrate and onto an $Al_2O_3$ substrate, without adding atoms such as carbon and silicon; Embodiment 1 is instances in which an AlN thin film 2 of approximately 5 nm thickness, containing 10 wt. % carbon, with the remainder being AlN and unavoidable impurities, was grown onto a GaN substrate and onto an $Al_2O_3$ substrate; Embodiment 2 is instances in which an AlN thin film 2 of approximately 5 nm thickness, containing 10 wt. % silicon, with the remainder being AlN and unavoidable impurities, was grown onto a GaN substrate and onto an $Al_2O_3$ substrate; and Embodiment 3 is instances in which an AlN thin film 2 of approximately 5 nm thickness, containing carbon and silicon at a combined total of 10 wt. %, with the remainder being AlN and unavoidable impurities, was grown onto a GaN substrate and onto an $Al_2O_3$ substrate.

As indicated in the table, it is evident that the degree of flatness in any of Embodiments 1 to 3 was markedly better than that in the comparative examples. Accordingly, it will be understood that deliberately adding atoms that are not unavoidable impurities allows the flatness of an AlN thin film 2 to be improved.

It should be noted that inasmuch as carbon and silicon are Group-IV atoms, implementations in which Group-IV atoms other than carbon and silicon are added presumably will also, in the same way, allow the flatness of an AlN thin film 2 to be improved. Likewise, in the implementations in which both carbon and silicon were added to the AlN thin film 2, excellent flatness was obtained, and thus implementations in which several types of atoms are added presumably will also allow the flatness of an AlN thin film 2 to be improved.

Further, given that Group-V atoms and Group-III atoms have properties near those of Group-IV atoms, a result similar to that in the case of carbon and silicon may be expected. Also, for the amount at which the atomic elements are added: as long as the quantity is at the level which allows distinction from unavoidable impurities—namely, 0.001 wt. % or more—a result along the lines of the foregoing may be anticipated.

Embodying Mode 2

Figure 4:
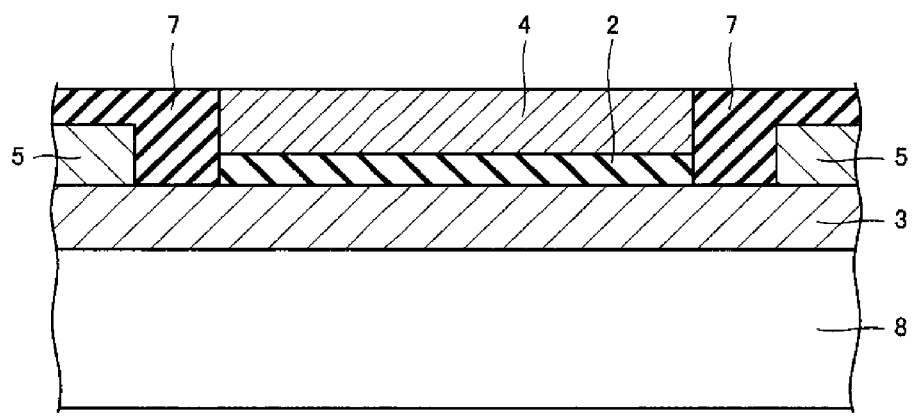
FIG. 4 is a sectional diagram representing a structural example of a tunneling magnetoresistive device in Embodying Mode 2 of the present invention.

Next, using FIGS. 3A, 3B, and FIG. 4, an explanation of Mode 2 of embodying the present invention will be made. FIGS. 3A and 3B are schematic diagrams for illustrating the operating principle of tunneling magnetoresistive devices, while FIG. 4 is a sectional diagram representing a structural example of a tunneling magnetoresistive device making application of an AlN thin film 2 in present Embodying Mode 1.

The AlN thin films 2 described above should be applicable in functional devices like tunneling magnetoresistive devices and giant magnetoresistive devices, employing magnetoresistance; in light-emitting devices like light-emitting diodes and laser diodes; and in rectifiers and various electronic devices such as transistors of all kinds, including bipolar transistors, field-effect transistors (FETs), spin-FETs, and high electron mobility transistors (HEMTs).

In this regard, as one example of an application of an AlN thin film 2 of the present invention, an implementation in which an AlN thin film 2 of the present invention is applied in a tunneling magnetoresistive device will be described.

To begin with, using FIGS. 3A and 3B the operating principle of tunneling magnetoresistive devices will be explained.

As shown in FIGS. 3A and 3B, first and second ferromagnetic electrode layers 30 and 40 are formed sandwiching a tunnel barrier layer 20 between them. One of the first and second ferromagnetic electrode layers 30 and 40 is a fixed layer, while the other is a recording layer.

As indicated in FIG. 3A, in a parallel magnetization situation, in which the magnetization directions of the first and second ferromagnetic electrode layers 30 and 40 are parallel, at the interfaces with the tunnel structure, the electrical resistance of the device in terms of a normal-line orientation will be small. As a result, electrons are able to pass through the tunnel barrier layer 20, such that electric current flows between the electrodes.

On the other hand, as indicated in FIG. 3B, in an antiparallel magnetization situation, in which the magnetization directions of the first and second ferromagnetic electrode layers 30 and 40 are antiparallel, at the interfaces with the tunnel structure, the electrical resistance of the device in terms of a normal-line orientation will be large. Electrons are consequently scattered at the interfaces with the tunnel structure, such that electric current does not flow between the electrodes.

Next, using FIG. 4 an explanation will be made of an example of a tunneling magnetoresistive device structure in which an above-described AlN thin film 2 has been applied.

In the FIG. 4 example, the tunneling magnetoresistive device is formed onto a substrate 8. A semiconductor substrate such as a GaN substrate can, for example, be used as the substrate 8.

A first ferromagnetic electrode layer 3, an AlN thin film 2 as a tunnel barrier layer, and a second ferromagnetic electrode layer 4 are formed in that order onto substrate 8. GaTMAs (TM—magnetic transition-metal ion) or GaTMN, for example, can be used for the first and second ferromagnetic electrode layers 3 and 4. The AlN thin film 2 can be formed by a method described earlier, while the first and second ferromagnetic electrode layers 3 and 4 can be formed, for example, by a PLD process, or by molecular beam epitaxy (MBE) or sputtering.

After the first ferromagnetic electrode layer 3, the AlN thin film 2, and the second ferromagnetic electrode layer 4 have each been formed, the layers are patterned into predetermined respective geometries. Further, after formation of the first ferromagnetic electrode layer 3, a conducting layer (electrode) 5 is formed onto the first ferromagnetic electrode layer 3. The conducting layer 5 is formed in a location where it will not overlap with the AlN thin film 2. The conducting layer 5 can be constituted by a metal material such as Cu, and is formable for example by creating a layer of metal material by a technique such as CVD or sputtering, and then patterning the metal-material layer into a predetermined geometry. Thereafter, an insulating layer 7 of silicon oxide or the like is formed, by CVD or a like technique, so as to cover the stacked-layer structure. The insulating layer 7 is subjected to a chemical mechanical polishing (CMP) operation, for example, to expose the surface of the second ferromagnetic electrode layer 4.

Next, a conducting layer (electrode) is formed onto the second ferromagnetic electrode layer 4. This conducting layer also is formed in a location where it will not overlap with the AlN thin film 2. This conducting layer too can be constituted by a metal material such as Cu, and is formable for example by creating a layer of metal material by a technique such as CVD or sputtering, and then patterning the metal-material layer into a predetermined geometry.

Going through the aforementioned steps makes it possible to create the tunneling magnetoresistive device represented in FIG. 4. A tunneling magnetoresistive device in present Embodying Mode 2 is furnished with, as the tunnel barrier layer, an AlN thin film 2 that, as described above, is of excellent flatness and lattice matching and is of superior insulating properties, thus making possible the realization of a high on/off ratio while reducing leakage current.

In the foregoing manner an explanation of modes of embodying the present invention has been conducted, yet the presently disclosed embodying modes should in all respects be considered to be illustrative and not limiting. The scope of the present invention is set forth by the scope of the patent claims, and includes meanings equivalent to the scope of the patent claims and all modifications within the scope.

The invention claimed is:

1. An aluminum nitride thin film, characterized by the following properties:
    containing between 0.001 wt. % and 10 wt. % of at least two additive atomic elements selected from the group consisting of Group-III atoms, Group-IV atoms and Group-V atoms; and
    a film thickness of not greater than 10 nm.

2. The aluminum nitride thin film set forth in claim 1, wherein said additive atomic elements are at least two types of atoms selected from the group consisting of carbon, silicon, germanium, gallium, indium, phosphorus, arsenic, boron, tin and antimony.

3. The aluminum nitride thin film set forth in claim 2, wherein said additive atomic elements are carbon and silicon.

4. The aluminum nitride thin film set forth in claim 1, wherein said film thickness is 5 nm.

5. The aluminum nitride thin film set forth in claim 1, further characterized by the property of a root mean square average surface roughness, in a plurality of 50 μm×50 μm sampling regions over the film, of 0.1 nm.

* * * * *